(12) United States Patent
Elsherbini et al.

(10) Patent No.: US 10,998,302 B2
(45) Date of Patent: May 4, 2021

(54) PACKAGED DEVICE WITH A CHIPLET COMPRISING MEMORY RESOURCES

(71) Applicant: Intel Corporation, Santa Clara, CA (US)

(72) Inventors: Adel Elsherbini, Tempe, AZ (US); Van Le, Beaverton, OR (US); Johanna Swan, Scottsdale, AZ (US); Shawna Liff, Scottsdale, AZ (US); Patrick Morrow, Portland, OR (US); Gerald Pasdast, San Jose, CA (US); Min Huang, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/586,167

(22) Filed: Sep. 27, 2019

(65) Prior Publication Data

US 2021/0098440 A1    Apr. 1, 2021

(51) Int. Cl.
*H01L 25/18*    (2006.01)
*G06F 13/40*    (2006.01)
(Continued)

(52) U.S. Cl.
CPC .......... *H01L 25/18* (2013.01); *G06F 13/4022* (2013.01); *G06F 13/4027* (2013.01); *H01L 25/0657* (2013.01); *H01L 25/50* (2013.01); *H01L 21/76898* (2013.01); *H01L 23/481* (2013.01); *H01L 25/043* (2013.01); *H01L 25/074* (2013.01); *H01L 25/0756* (2013.01); *H01L 2225/06513* (2013.01); *H01L 2225/06524* (2013.01); *H01L 2225/06541* (2013.01); *H01L 2225/06548* (2013.01); *H01L 2225/06555* (2013.01); *H01L 2225/06586* (2013.01)

(58) Field of Classification Search
CPC ............. H01L 23/481; H01L 21/76898; H01L 25/043; H01L 25/0657; H01L 25/074; H01L 25/0756; H01L 2225/06541
See application file for complete search history.

(56) References Cited

U.S. PATENT DOCUMENTS 8,584,061 B2* 11/2013 Shibata .................. G11C 5/063
                                                 716/100
9,219,042 B2* 12/2015 Paek ....................... H01L 24/13
(Continued)

OTHER PUBLICATIONS

Non-Final Office Action for U.S. Appl. No. 16/586,145, dated Oct. 29, 2020.

*Primary Examiner* — David A Zarneke
(74) *Attorney, Agent, or Firm* — Green, Howard & Mughal LLP.

(57) ABSTRACT

Techniques and mechanisms for providing at a packaged device an integrated circuit (IC) chip and a chiplet, wherein memory resources of the chiplet are accessible by a processor core of the IC chip. In an embodiment, a hardware interface of the packaged device includes first conductive contacts at a side of the chiplet, wherein second conductive contacts of the hardware interface are electrically interconnected to the IC chip each via a respective path which is independent of the chiplet. In another embodiment, one or more of the first conductive contacts are configured to deliver power, or communicate a signal, to a device layer of one of the IC chip or the chiplet.

20 Claims, 10 Drawing Sheets

(51) Int. Cl.
*H01L 25/065* (2006.01)
*H01L 25/00* (2006.01)
*H01L 23/48* (2006.01)
*H01L 25/075* (2006.01)
*H01L 21/768* (2006.01)
*H01L 25/07* (2006.01)
*H01L 25/04* (2014.01)

(56) References Cited

U.S. PATENT DOCUMENTS

| | | | |
|---|---|---|---|
| 9,275,929 B2* | 3/2016 | Liou | H01L 23/60 |
| 9,324,698 B2* | 4/2016 | Yu | H01L 23/3128 |
| 9,368,479 B2* | 6/2016 | Katkar | H01L 25/50 |
| 9,418,967 B2* | 8/2016 | Koshiishi | H01L 23/50 |
| 9,570,399 B2* | 2/2017 | Yang | H01L 21/76877 |
| 9,589,945 B2* | 3/2017 | Jo | H01L 25/18 |
| 9,978,694 B2* | 5/2018 | Cho | H01L 23/3135 |
| 10,026,715 B2* | 7/2018 | Kume | H01L 25/0657 |
| 10,276,544 B2* | 4/2019 | Matsumoto | H01L 23/3128 |
| 10,347,598 B2* | 7/2019 | Baek | H01L 23/49833 |
| 10,510,650 B2* | 12/2019 | Yu | H01L 23/5389 |
| 2019/0393190 A1 | 12/2019 | Delacruz et al. | |

* cited by examiner

PACKAGED DEVICE WITH A CHIPLET COMPRISING MEMORY RESOURCES

CROSS REFERENCE TO RELATED APPLICATIONS

This application is related to U.S. patent application Ser. No. 16/586,145, filed on Sep. 27, 2019, entitled "COMPOSITE IC CHIPS INCLUDING A CHIPLET EMBEDDED WITHIN METALLIZATION LAYERS OF A HOST IC CHIP", and to U.S. patent application Ser. No. 16/586,158, filed Sep. 27, 2019, entitled "VIAS IN COMPOSITE IC CHIP STRUCTURES".

BACKGROUND

1. Technical Field

This disclosure generally relates to integrated circuitry and more particularly, but not exclusively, to a memory array which is integrated in a chiplet of a packaged device.

2. Background Art

The term "data locality" refers to a physical proximity of a memory resource, which is for storing data, to compute circuitry which accesses the data to or from said memory resource. Data locality is important in many graphics and other computational applications. Typically, a relatively close locality of data and compute circuitry is associated with improvements to processor execution speed, and overall throughput. As a result, close data locality often contributes to energy efficiency for data loading operations and/or data storing operations by a processor.

Hierarchical cache systems are one example of a technology that provides improvements to data locality. However, there are various manufacturing and performance limitations associated with the integration of cache memory with one or more processor cores in a monolithic integrated circuit (IC) chip. Such limitations include difficulties associated with fabricating large IC chips, inefficiencies with associated circuit logic, and increased routing latency and/or power consumption, especially for central processing units (CPUs) or graphical processing units (GPUs) with large core counts.

As successive generations of semiconductor fabrication continue to scale in terms of size, operational speed, and power efficiency, there is expected to be an increasing demand placed on solutions to improve the locality of data for use by one or more processor cores.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1A:
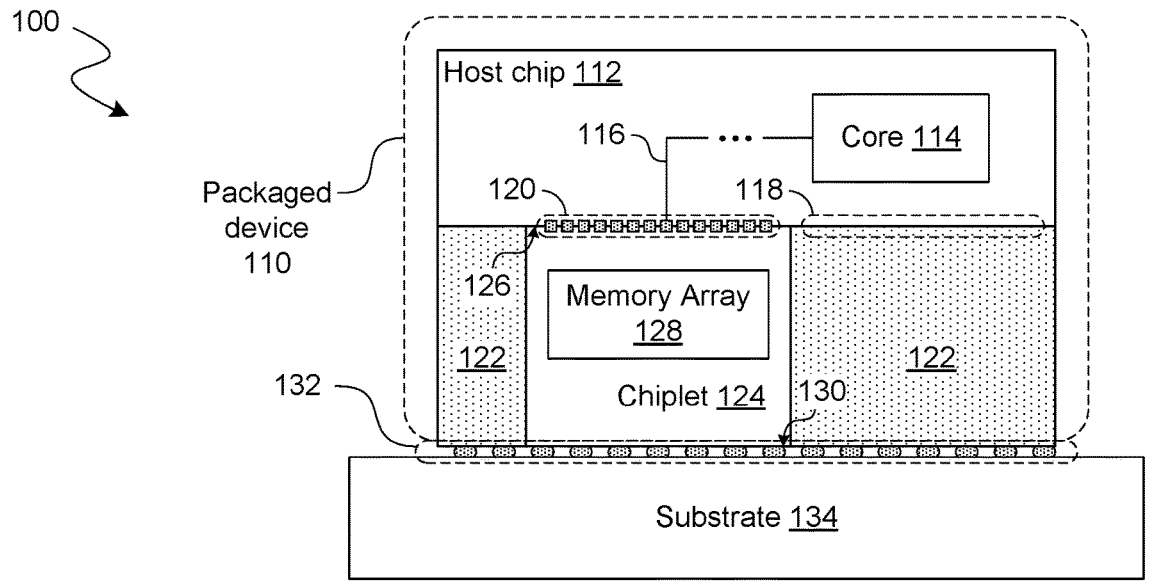
FIG. 1A illustrates a cross-sectional side view showing elements of a system to provide access to a memory of a chiplet according to an embodiment.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or BE" and "A or BE" mean (A), (BE), or (A and BE). For the purposes of the present disclosure, the phrase "A, BE, and/or C" means (A), (BE), (C), (A and BE), (A and C), (BE and C), or (A, BE and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, BE or C" can mean A; BE; C; A and BE; A and C; BE and C; or A, BE and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

It is pointed out that those elements of the figures having the same reference numbers (or names) as the elements of any other figure can operate or function in any manner similar to that described, but are not limited to such.

Embodiments described herein variously provide techniques and mechanisms for a packaged device to include an IC chip and a chiplet which is coupled thereto, wherein memory resources of the chiplet are accessible by one or more processor cores of the IC chip. In some embodiments, a hardware interface of such a packaged device includes one or more conductive contacts at a side of the chiplet—e.g., wherein one or more other conductive contacts of that same hardware interface are electrically interconnected to the IC chip each via a respective path which is independent of the chiplet. As used herein, "host chip" refers to an IC chip which includes one or more processor cores, and "chiplet" refers to a relatively small IC die structure that (for example) extends along only a portion of such a host chip.

In some embodiments, one or more chiplets are variously coupled to the host chip, wherein each of the one or more chiplets includes a respective cache—e.g., including a last level cache (LLC)—which is accessible to one or more cores of the host chip. Such embodiments variously facilitate data caching which, as compared to conventional architectures, is relatively high density and is closely localized with respect to processor circuitry. Additionally or alternatively, such embodiments enable the adaptation of legacy host chip technologies for use with a newer cache memory technology—e.g., even where the cache memory technology might undergo additional development before full integration in one or more applications.

Some embodiments provide improved power efficiency for workloads, such as those of various mobile applications, wherein one or more cores are frequently put in a low power state when there is no user input. Traditionally, such low power state are achieved by saving some processor core state in an SRAM cache that is located on the host die—e.g., wherein a CPU core of the host die is turned off while the SRAM is remains powered. To further reduce power consumption in such applications, some embodiments variously store processor core state to an NVM of a chiplet which is in-package with the host chip. In providing such an NVM chiplet, some embodiments facilitate reduced energy overhead, and/or enable faster sleep/wake cycles.

Additionally or alternatively, some embodiments variously facilitate modularity by enabling the use of one type of host die with any of various types of memory chiplets—e.g., allowing variety between different stock keeping units (SKUs) without the tape out of different masks being required.

FIG. 1A shows features of a system 100 to provide efficient access to memory resources according to an embodiment. System 100 is one example of an embodiment wherein a packaged device comprises an IC chip and a chiplet which include (respectively) one or more processor cores and a memory which is accessible to the one or more processor cores. A hardware interface of one such embodiment comprises conductive contacts at a side of the chiplet, and additional conductive contacts which are variously offset from said side of the chiplet.

As shown in FIG. 1A, system 100 includes a packaged device 110 and a substrate 134 which is coupled thereto via a hardware interface 132. Host chip 112 includes one or more processor cores which are each to operate as a consumer of memory resources, and chiplet 124 includes one or more memory arrays which are coupled to be accessible each by a respective processor core of host chip 112. In this particular context, "memory," "memory array," "memory resource" and related terms—unless otherwise indicated—refer herein to either of cache memory or non-cache memory (such as system memory, for example). Similarly, "memory controller," unless otherwise indicated, refers herein to controller circuitry which provides access to one of cache memory or non-cache memory. For example, "cache controller" is used herein to more particularly refer to a memory controller which provides access to a cache memory.

Substrate 134 comprises one or more electrical interconnects which are each to facilitate communication between packaged device 110 and one or more other devices (not shown) which are included in—or alternatively, are to couple to—system 100. In an embodiment, substrate 134 is (or otherwise includes) a package substrate, an interposer, or any of various other structures which are suitable to communicate one or more signals and/or one or more voltages, for example. In some alternative embodiments, system 100 omits substrate 134—e.g., wherein said embodiments are variously implemented solely with structures of packaged device 110.

In the example embodiment shown, host chip 112 is coupled to chiplet 124 via another hardware interface 120, conductive contacts of which (e.g., the contacts including copper pads, solder interconnects, or the like) are disposed at a side 126 of chiplet 124 that extends along, and overlaps, a first surface region of host chip 112. Such a first surface region is to be distinguished, for example, from one or more other surface regions (e.g., including the illustrative second surface region 118 shown) which are not overlapped by side 126.

Hardware interface 132 comprises at least some conductive contacts which, by contrast, are disposed at another side 130 of chiplet 124 which is opposite side 126. In some embodiments, hardware interface 132 extends past one or more edges of chiplet 124—e.g., wherein other contacts of hardware interface 132 are variously disposed along one or more portions of packaged device 110 (e.g., including the illustrative portions 122 shown) which each extend between sides 126, 130 along a respective sidewall of chiplet 124. For example, some or all such other contacts overlap the second surface region 118—e.g., wherein, of chiplet 124 and hardware interface 132, the second surface region 118 of host chip 112 is overlapped by only hardware interface 132.

In various embodiments, a first minimum metallization feature pitch of hardware interface 120 is smaller than a corresponding second minimum metallization feature pitch of hardware interface 132. By way of illustration and not limitation, hardware interface 120 exhibits a first average minimum distance between closest conductive contacts—e.g., wherein said first average minimum distance is less than (e.g., at least 10% less than) a second average minimum distance between closest conductive contacts of hardware interface 132. Additionally or alternatively, in some embodiments, a first average cross-sectional area of contacts of hardware interface 120 is less than (e.g., at least 10% less than) a second average cross-sectional area of contacts of hardware interface 132.

Host chip 112 comprises a processor core 114 which is to operate as a consumer of memory resources. For example, host chip 112 is to execute an operating system, a binary input/output system (BIOS), and/or any of various other software processes. To facilitate execution of such software, chiplet 124 comprises one or more memory arrays (e.g., including the illustrative memory array 128 shown) which are coupled to be accessible to processor core 114 via the hardware interface 120 (and, for example, via an interconnect structure 116 which is coupled between core 114 and hardware interface 120). In one embodiment, memory array 128 comprises static random access memory (SRAM) cells or dynamic random access memory (DRAM) cells. Additionally or alternatively, processor core 114 is coupled to cache data to memory array 128—e.g., wherein processor core 114 is coupled to access a last level cache (LLC) of memory array 128. In various other embodiments, memory array 128 comprises non-volatile memory (NVM) cells.

In some embodiments, chiplet 124 further comprises a memory controller (not shown)—coupled between hardware interface 120 and memory array 128—which is to control memory access on behalf of a process which is executed with core 114. However, in other embodiments, at least some memory controller logic to operate memory array 128 resides on host chip 112—e.g., in a device layer of host chip 112 which also includes core 114.

In some embodiments, host chip 112 further comprises one or more other processor cores (not shown) some or all of which also have access each to a respective portion of memory array 128. However, in other embodiments, host chip 112 omits any such additional cores, and/or said additional cores are able to access memory array 128 (if at all) only via core 114. By providing memory array 128 in a chiplet 124 which is disposed between hardware interface 132 and host chip 112, some embodiments—as compared to previous techniques and architectures—variously facilitate an improved locality of data for use by one or more cores of packaged device 110. This improved data locality enables an access to memory resources which is relatively more space efficient, time efficient and/or power efficient—e.g., as compared to requiring that such access take place via substrate 134. Additionally or alternatively, some embodiments variously provide variation between respective memory types and/or processes of a host chip and a chiplet—e.g., wherein a distinct SRAM process or DRAM process is provided on a chiplet in lieu of a use of monolithically integrated memory on the host chip.

In some embodiments, at least one contact of hardware interface 132—including a contact at side 130, for example—is coupled (or otherwise accommodates coupling) to facilitate communication of a signal or voltage, via an interconnect of chiplet 124, to a first device layer of host chip 112 and/or to a second device layer of chiplet 124. In one such embodiment, the first device layer comprises active circuit elements including those of core 114, and the second device layer comprises active circuit elements of memory array 128—e.g., wherein one of the first device layer or the second device layer is coupled to be powered at least in part by a supply voltage which is provided via an interconnect (not shown) which extends to hardware interface 132 and at least partially through chiplet 124. Although some embodiments are not limited in this regard, such an interconnect extends to each of hardware interfaces 120, 132, for example.

In some embodiments, one or more contacts of hardware interface 132 are variously coupled (or otherwise accommodate coupling) each to facilitate a respective signal communication and/or voltage communication between hardware interface 132 and host chip 112 independent of chiplet 124. In one such embodiment, one of portions 122 has formed therein an interconnect structure (not shown) which extends to a contact of hardware interface 132 that is offset from side 130 of chiplet 124. Such an interconnect structure is, for example, coupled to another conductive contact (not shown) at surface region 118 of host chip 112. By way of illustration and not limitation, in some embodiments, a given one of portions 122 comprises copper pillar structures (not shown) which variously extend from surface region 118 to hardware interface 132, wherein a mold compound, an interlayer dielectric or other such insulator material of portions 122 extends around (and, for example, between) various ones of said copper pillar structures. Alternatively or in addition, a given one of portions 122 comprises patterned metallization layers which are variously coupled by via structures to one another, to hardware interface 132, and to contacts (not shown) in surface region 118. An interlayer dielectric material provides electrical insulation between such patterned metallization layers, for example. In some embodiments, a mold compound, interlayer dielectric (ILD) and/or any other such insulator material of portions 122 is to be distinguished, for example, from an underfill (if any) which is deposited under and/or around packaged device 110 to facilitate coupling of packaged device 110 with substrate 134.

Figure 1B:
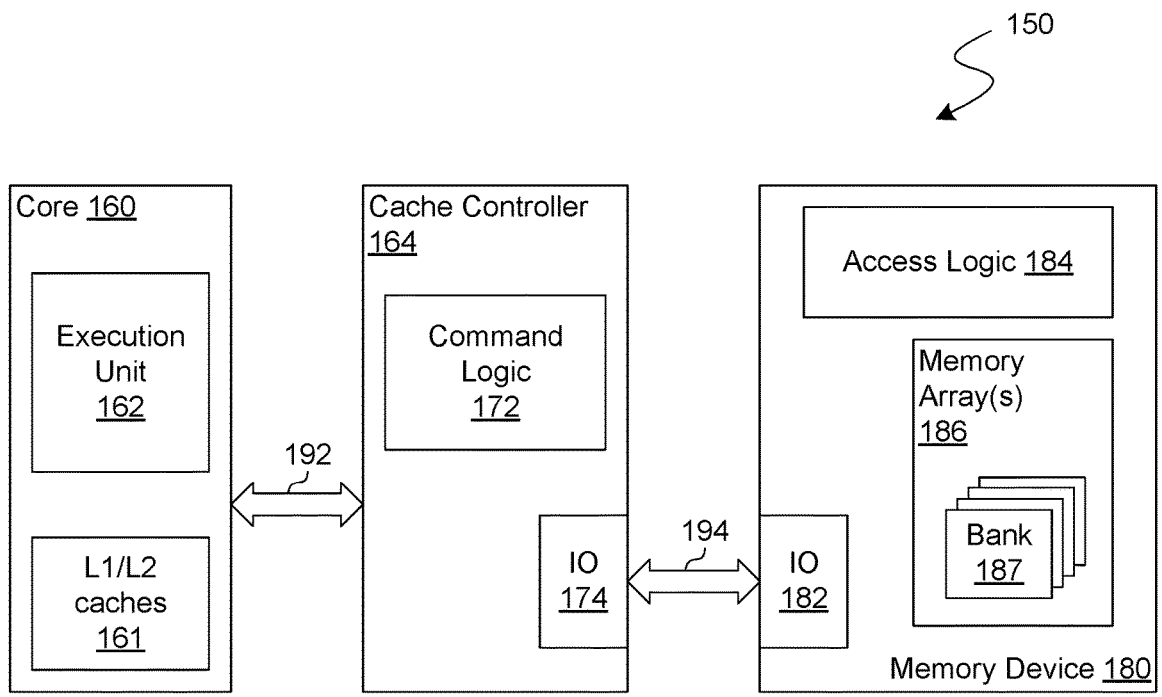
FIG. 1B illustrates a functional block diagram showing elements of a system to provide memory functionality with a chiplet according to an embodiment.

FIG. 1B shows features of a system 150 to efficiently access a memory resource of a chiplet according to an embodiment. System 150 illustrates one embodiment wherein a packaged device includes a host chip and a chiplet coupled thereto, wherein a memory array of the chiplet is accessible by a processor core of the host chip. System 150 includes features of system 100, for example.

As shown in FIG. 1B, system 150 comprises a cache controller 164 and a memory device 180 coupled thereto via an interconnect 194. Cache controller 164 is further coupled to a processor core 160 of system 150 via an interconnect 192 which, in some embodiments, is an interconnect of a network-on-chip (NoC). In the example embodiment shown, an execution unit 162 of core 160 comprises circuitry to execute an operating system, a binary input/output system (BIOS), and/or any of various other software processes. In aid of such execution, core 160 further includes one or more local caches (e.g., including the illustrative L1 and L2 caches 161 shown), and circuitry to request cached data or to pre-populate a cache with data that is predicted to be used in the future. Functionality of cache controller 164—e.g., to manage cache entries and/or to support a cache coherency scheme—includes one or more operations which, for example, adapted from conventional data caching techniques.

Memory device 180 includes any of a variety of types of memory technology that, for example, have rows of memory cells, where data is accessible via a wordline or the equivalent. In one embodiment, memory device 180 includes dynamic random access memory (DRAM) technology.

Memory device 180 includes one or more memory arrays 186 which, for example, include one or more logical and/or physical groups of memory. An example of such grouping of memory is illustrate by banks 187 of memory resources which, for example, each include a respective array of storage elements arranged in rows and columns. Memory device 180 includes access logic 184 to facilitate, at least in part, access to the one or more memory arrays 186—e.g., where such access is provided for servicing one or more commands from cache controller 164. In an embodiment, access logic 184 includes, or operate in conjunction with, logic of memory device 180 which (for example) provides resource access according to conventional techniques.

Cache controller 164 sends commands or instructions to memory device 180 over one or more buses such as a command/address (CA) bus, not shown, of an interconnect 194. Such commands are interpreted by memory device 180—e.g., including memory device 180 decoding command information to perform a variety of access functions within the memory and/or decoding address information with column logic and/or row logic. For example, such logic accesses a specific location in one of banks 187 with a combination of a column address strobe or signal (CAS) and a row address strobe or signal (RAS). In some embodiments, rows of memory are implemented in accordance with known memory architectures or their derivatives. For example, a row of a given one of banks 187 includes one or more addressable columns of memory cells, as identified by the CAS generated by column logic of memory device 180. The rows are variously addressable each via the RAS generated by row logic of memory device 180.

In an embodiment, access to the one or more memory arrays 186 is for the purpose of writing data exchanged—and/or reading data to be exchanged—via a data bus coupled to IO circuitry 182 of memory device 180. For example, data bus signal lines (not shown) of interconnect 194 couple IO circuitry 174 of cache controller 164 to IO circuitry 182 and/or one or more other memory devices (not shown). In an embodiment, cache controller 164 includes command logic 172—e.g., including any of a variety of hardware logic and/or executing software logic—to send commands via a CA bus of interconnect 194. Command logic 172 includes or couples to logic of memory controller which performs operations to generate, transmit or otherwise determine commands sent (in some embodiments) according to one or more conventional techniques.

In various embodiments, some or all of system 150 is implemented by a packaged device which comprises one or more host chips and one or more chiplets which are variously coupled each to a respective one of said one or more host chips, wherein one such host chip includes core 160, and wherein chiplet coupled thereto includes one or more memory resources including, for example, some or all of the one or more memory arrays 186 (and, for example, access logic 184). By way of illustration and not limitation, in some embodiments, core 160 corresponds functionally to core 114—e.g., wherein or some or all of banks 187 corresponds functionally to memory array 128. In one such embodiment, cache controller 164 resides on the chiplet—e.g., wherein interconnect 192 includes or couples to one or more contacts of a hardware interface such as hardware interface 120. In an alternative embodiment, at least some circuitry of cache controller 164 resides on the host chip—e.g., wherein interconnect 194 includes or couples to one or more contacts of a hardware interface such as hardware interface 120. By providing SRAM, DRAM, NVM or other memory on a chiplet which is disposed between a hardware interface of a packaged device (such as interface 132, for example) and a host chip of the packaged device, system 150 facilitates an improved locality of data for use by one or more cores.

Figure 2:
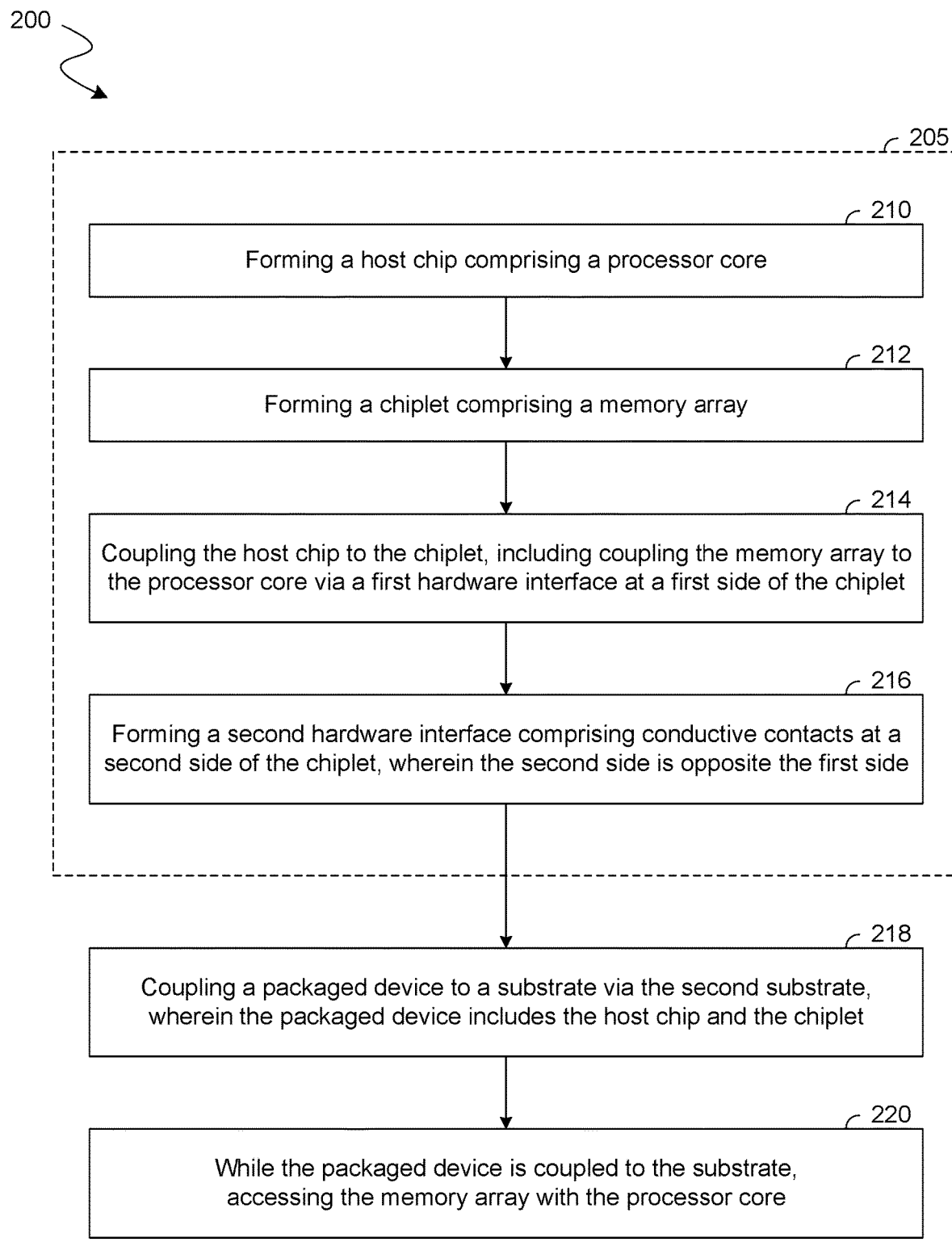
FIG. 2 illustrates a flow diagram showing elements of a method to provide memory functionality with a chiplet according to an embodiment.

FIG. 2 shows features of a method 200 to provide access to a memory of a chiplet to a host chip according to an embodiment. Method 200 is performed to provide functionality of system 100 or packaged device 150, for example. In various embodiments, method 200 comprises operations (e.g., including the illustrative operations 205 shown) to fabricate a packaged device which, for example, includes features of packaged device 110. Additionally or alternatively, method 200 comprises one or more other operations which are performed with such a packaged device.

For example, as shown in FIG. 2, operations 205 includes (at 210) forming a host chip—such as host chip 112—which comprises a processor core. In some embodiments, the host chip comprises multiple cores—e.g., wherein a network node of the host chip includes said multiple cores and, for example, any of various suitable arrangements of switches, routers and/or bridges to facilitate communication between said cores. Operations 205 further comprise (at 212) forming a chiplet which comprises a memory array—e.g., including memory array 128. In an embodiment, chiplet includes one or more arrays of volatile memory including, for example, SRAM cells and/or DRAM cells. Alternatively, the chiplet includes one or more non-volatile memory (NVM) arrays. In some embodiments, the forming at 210 and/or at 212 comprises operations which, for example, are adapted from conventional semiconductor fabrication techniques.

Operations 205 further comprise (at 214) coupling the host chip to the chiplet, including coupling the memory array to the processor core via a first hardware interface—e.g., hardware interface 120—at a first side of the chiplet. For example, the coupling at 214 comprises forming solder interconnects between the host chip and the chiplet, in some embodiments. Alternatively or in addition, the coupling at 214 comprises forming any of various direct (for example, copper-to-copper) interconnects between the host chip and the chiplet—e.g., by thermocompression bonding, hybrid bonding or the like. In some embodiments, the processor core is coupled to cache data to (and/or access cached data from) the memory array via the first hardware interface. In one such embodiment, the memory array is coupled to provide a last level cache (LLC) for one or more processor cores of the host chip.

Operations 205 further comprise (at 216) forming a second hardware interface which comprises conductive contacts at a second side of the chiplet, wherein the second side is opposite the first side. The chiplet overlaps a first surface region of the host chip—e.g., wherein some contacts of the second hardware interface are at a side of the chiplet (such as side 130) which overlaps the first surface region. In one such embodiment, other contacts of the second hardware interface are offset from the chiplet and overlap a second surface region of the host chip (such as surface region 118)—e.g., wherein, of the chiplet and the second hardware interface, the second surface region of the host chip is overlapped by only the second hardware interface.

In some embodiments, the forming at 216 comprises depositing or otherwise building interconnect structures (of portions 122) which variously extend, from the host chip, through one or more dielectric layers which surround or otherwise adjoin one or more sidewall structures of the chiplet. In one such embodiment, the chiplet is formed at least in part from a larger chiplet which, after being coupled to the host chip via the first hardware interface, is subjected to one or more grinding, polishing and/or other subtractive processes. The forming at 216 includes (for example) processing adapted from conventional mask, deposition, and etch techniques to form conductive contacts of a hardware interface. In various embodiments, a first minimum metallization feature pitch of the first hardware interface is smaller than a second minimum metallization feature pitch of the second hardware interface In various embodiments, the host chip comprises a network which includes the processor core—e.g., wherein at least some nodes of the network are coupled to one another in an array configuration comprising rows and columns. To facilitate communication to and/or from the network, the host chip further comprises, for example, one or more physical layer (PHY) circuits which are each coupled to the array configuration via a respective end of one of the rows or columns. In one such embodiment, the memory array of the chiplet is coupled to support at least some communication with the processor core that is independent of any PHY circuit of the device layer which is coupled to the network via a respective end of one of the rows or one of the columns. For example, at least some other IO circuitry of the host chip is coupled between a contact of the first hardware interface and a node of the array configuration. In various embodiments, the host chip further comprises memory controller circuitry which is coupled between the processor core and the first hardware interface—e.g., wherein the memory controller circuitry provides the processor core with access to the memory array of the chiplet.

In various embodiments, method 200 additionally or alternatively comprises processes which are performed with a packaged device such as one resulting from operations 205. For example, method 200 further comprises (at 218) coupling a substrate, via the second substrate, to a packaged device which includes the host chip and the chiplet. For example, the substrate (e.g., substrate 134) is that of a silicon interposer, a package substrate, or a circuit board, in some embodiments. In one such embodiment, method 200 further comprises (at 220) accessing the memory array with the processor core, the accessing while the packaged device is coupled to the substrate.

Figure 3:
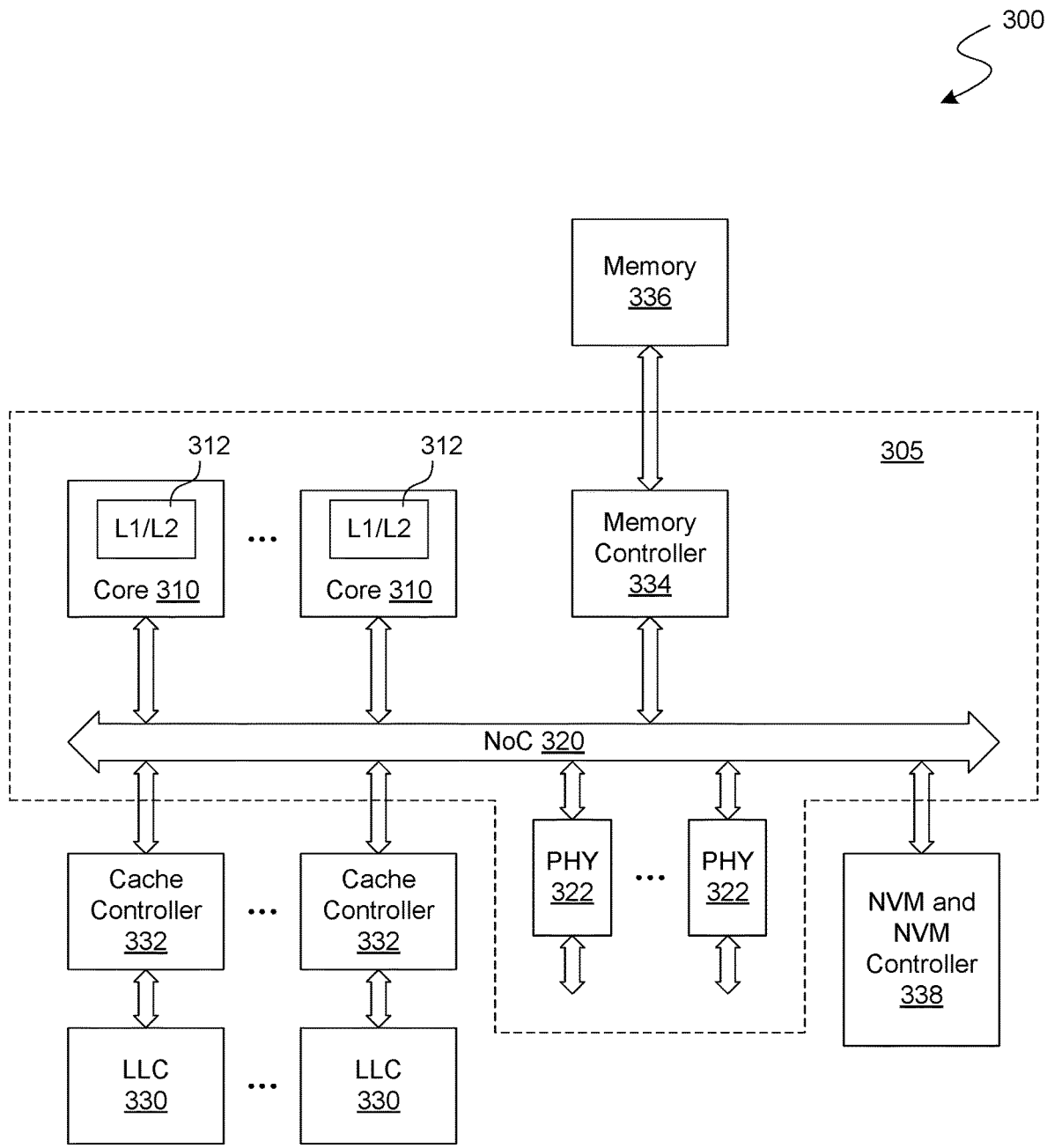
FIG. 3 illustrates a functional block diagram showing elements of a multi-core system including a memory chiplet according to an embodiment.

FIG. 3 shows features of a system 300 to efficiently access memory resources of a chiplet according to an embodiment. System 300 is one example of an embodiment wherein a packaged device comprises a host chip and one or more chiplets each disposed under a respective region of the host chip, wherein multiple processor cores of the host chip are each configured to access memory resources of a respective chiplet. In various embodiments, system 300 includes features of system 100 or packaged device 150—e.g., where functionality of system 300 is provided according to method 200.

As shown in FIG. 3, system 300 includes a host chip and a chiplet coupled thereto (e.g., host chip 112 and chiplet 124, respectively), wherein the host chip comprises at least some circuit resources 305. Circuit resources 305 depict an abstracted block-level view of selected components and functional blocks of a processing-capable chip according to one illustrative embodiment. These components include multiple processor cores 310, which provide the primary processing operations of the host chip. While the exemplary embodiment shown depicts at least three processor cores of circuit resources 305, it will be recognized that circuit resources 305 could include any of various numbers of processor cores, such as 1, 2, 4, 6, 8, 10, 12, etc. Cores 310 are variously coupled to each other (e.g., via the illustrative network-on-chip NoC 320 shown). The NoC 320 is generally representative of various circuitry that supports communication between components in circuit resources 305, including busses, routers, and control logic, as applicable. Further details of such connections are not shown so as to not obscure the detail of system 300.

In various embodiments, the host chip comprises any of various interfaces for communication with components external to the host chip, such as disk drives and other input/output (IO) devices, network interfaces, BIOS/firmware, and peripheral devices, as well as other chips that may be coupled to the host chip via CPU socket-to-socket interconnects or other forms of interconnects used for communication between chips. For example, interfaces to facilitate communication to external components include various physical layer (PHY) circuits—such as the illustrative PHYs 322 shown—which each include respective transmitter circuits and receiver circuits. In one such embodiment, one or more of PHYs 322 are each to couple to a respective PCIe interconnect—e.g., wherein PHYs 322 include one or more x16 PCIe interfaces (each with a link width of 16 lanes), one or more x8 PCIe interfaces (each with a link width of 8 lanes), or the like. However, the link widths and numbers of such PCIe interfaces are merely exemplary, and not limiting on some embodiments. Such PCIe interfaces are used, for example, to interface with various peripheral and system components, such as PCIe expansion slots, video cards, video chips, etc.

System 300 further comprises memory and memory logic resources, at least some of which reside on a chiplet which is coupled to the host chip which includes circuit resources 305. In one such embodiment, such memory access resources support data caching and coherency functionality—e.g., wherein some or all of cores 310 each include or otherwise have access to a respective multiple levels of caches, with caches closest to a given core having the least latency and smallest size, and the caches further away being larger but having more latency. For example, one typical configuration employs first and second level caches, commonly referred to as L1 and L2 caches. Another common configuration may further employ a third level or L3 cache. In the context of packaged devices variously disclosed herein, a highest level cache is termed the Last Level Cache, or LLC. For example, the LLC for a given core may typically comprise an L3-type cache if L1 and L2 caches are also employed, or an L2-type cache if the only other cache is an L1 cache. Of course, this could be extended to further levels of cache, with the LLC corresponding to the last (i.e., highest) level of cache.

In the example embodiment shown, system 300 comprises first level (L1) and second level (L2) caches (as depicted by L1/L2 blocks 312) that are "private" each to a respective one of processor cores 310. Cores 310 are also variously coupled to one or more last level caches (LLCs) 330 each via NoC 320 and a respective cache controller 332. The memory access resources further comprise a memory device 336 and a memory controller 334 which provides cores 310 with access to memory device 336. Cache controllers 332 each provide respective caching agent functionality and/or coherency agent (or "home agent") functionality which, for example, manages data within a respective one of LLCs 330. In some embodiments, system 300 comprises other PHY circuitry (not shown) to facilitate communication between various ones of the one or more LLCs 330, cache controllers 332, memory controller 334, and memory device 336.

In some embodiments, memory device 336 provides system memory which, for example, is arranged as memory blocks representing a logical partitioning of memory resources to be accessed via memory controller 334. In one such embodiment, memory device 336 comprises one or more memory modules—e.g., wherein memory controller 334 is coupled to memory device 336 via one or more DDR interfaces, such as DDR3 interfaces.

In various embodiments, a packaged device of system 300 comprises the host chip (which includes circuit resources 305), as well as one or more chiplets which, in turn, each include a respective memory access resource which is available to some or all of cores 310. By way of illustration and not limitation, one such chiplet of the packaged device includes some or all of the one or more LLCs 330—e.g., wherein a cache of such a chiplet comprises SRAM cells. In one such embodiment, the same chiplet (or another chiplet of the packaged device) further comprises cache controller 332. Alternatively, the host chip comprises cache controller 332, in various embodiments.

Alternatively or in addition, a chiplet of the packaged device comprises other types of memory—e.g., including one or more memory arrays of the illustrative non-volatile memory (NVM) and NVM controller 338 shown. In providing NVM resources at a chiplet, some embodiments enable efficient storage of core state (e.g., for one or more of cores 310) with said chiplet during power delivery which is very low, as compared to that used for conventional storage of such core state in an off-package NVM. Additionally or alternatively, providing NVM resources at a chiplet enables low latency retrieval of state from the chiplet to various ones of cores 310.

Figure 4:
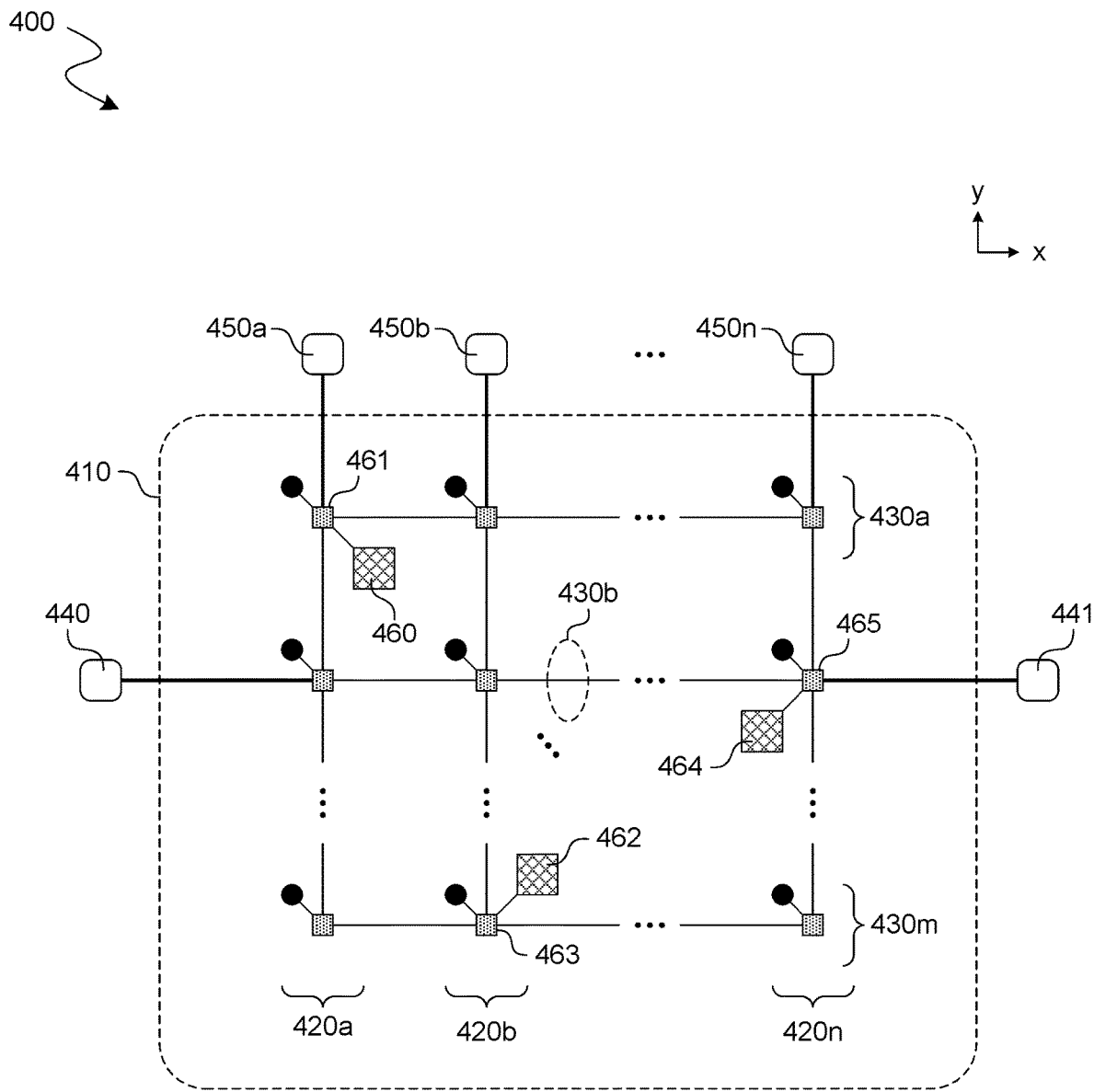
FIG. 4 illustrates a layout diagram showing elements of an integrated circuit chip which is configured to access a memory chiplet according to an embodiment.
Figure 4:
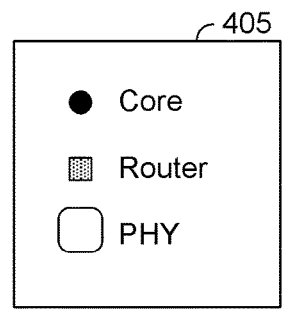

FIG. 4 shows features of an IC chip 400 to access memory resources of a chiplet according to an embodiment. IC chip 400 is one example of an embodiment wherein a processor core, in a network of a host chip that is to be included in a packaged device, is provided with a path to access a chiplet of the packaged device. The path, which extends to the core and to the chiplet, is independent of any PHY circuit of the host chip which is coupled at an edge of the network. In various embodiments, IC chip 400 includes features of host chip 112 or circuit resources 305—e.g., where IC chip 400 is to be coupled to operate with a memory of a chiplet according to method 200.

As shown in FIG. 4, IC chip 400 includes a network 410 of nodes—e.g., including at least some processor cores and, for example, any of various switches, bridges, or routers (see legend 405)—where at least some of said nodes are coupled to one another in an array configuration comprising rows and columns. By way of illustration and not limitation, network 410 includes router nodes which are variously coupled to one another in an array of rows 430a, 430b, ..., 430m and columns 420a, 420b, ..., 420n. In one such embodiment, these routers facilitate a network on chip (e.g., including mesh fabric) for switched communication between processor cores, memory controllers, caches, PCIE I/O circuits and/or other network agents.

In various embodiments, IC chip 400 further comprises one or more physical layer (PHY) circuits which are variously coupled to network 410 each via a respective end of one of rows 430a, 430b, ..., 430m and/or at a respective end of one of columns 420a, 420b, . . . , 420n. The one or more PHY circuits each include respective transmitter circuitry and/or respective receiver circuitry to facilitate communication between network 410 and other circuitry (not shown) which is coupled to, or is to be coupled to, network 410. By way of illustration and not limitation, network 410 is formed in a region of IC chip 400—e.g., wherein PHYs 450a, 450b, . . . , 450n of IC chip 400 are arranged along a side of the region and variously coupled at ends of columns 420a, 420b, . . . , 420n (respectively). Alternatively or in addition, one or more PHYs (such as the illustrative PHYs 440, 441 shown) are each coupled at a respective end of one of rows 430a, 430b, . . . , 430m. In an embodiment, a given one of PHY circuits 450a, 450b, . . . , 450n and/or one of PHY circuits 440, 441 includes (for example) a PHY for providing access to a memory, or a PHY of a high-speed IO port.

In some embodiments, IC chip 400 is coupled, or otherwise accommodates such coupling, to enable at least some communication between a processor core of network 410 and a memory array of a chiplet (not shown), where such communication—but not necessarily all communication between the host chip and the chiplet—is independent of any PHY circuit of IC chip 400 which is coupled to network 410 via a respective end of a row or column of the array configuration. For example, one or more nodes of the array configuration each have at least one additional port—other than any for linking to another router or to another processor core of network 410—which is available to be coupled to a chiplet (not shown) of a packaged device which also includes IC chip 400. By way of illustration and not limitation, a router 461, which is in both row 430a and column 420a, is coupled to cache controller circuitry 460 that facilitates access to memory resources of the chiplet. Additionally or alternatively, a router 463, which is in both row 430m and column 420b, is coupled to cache controller circuitry 462 that facilitates access to memory resources of the same chiplet (or alternatively, another chiplet of the packaged device). Additionally or alternatively, a router 465, which is in both row 430b and column 420n, is coupled to cache controller circuitry 464 that facilitates access to memory resources of a chiplet. In one such embodiment, microbumps, hybrid bonding pads and/or other vertical (z-axis) interconnect structures of IC chip 400 facilitate coupling of cache controller circuitry 460, 462, 464 each to a respective chiplet, such as chiplet 124. A given one of cache controller circuitry 460, 462, 464 provides functionality such as that of cache controller 164 or one of cache controllers 332, for example.

In various embodiments, cache controller circuitry 460, 462, 464 each resides on IC chip 400. However, in other embodiments, a given one of cache controller circuitry 460, 462, 464 includes at least some circuitry which resides on a chiplet—e.g., wherein a corresponding one of routers 461, 463, 465 is coupled such circuitry via a hardware interface such as hardware interface 120. In allowing one or more cores of network 410 to access memory resources of a chiplet, without requiring communication via an edge of network 410, some embodiments variously provide improved data locality for a core that, for example, is offset from an edge of a mesh (or other) multi-processor network architecture. Additionally or alternatively, some or all such embodiments variously provide improved cache capacity if, for example, a chiplet includes a higher density memory types such as stacked SRAM or DRAM.

It is to be appreciated by one of ordinary skill in the relevant technology, with the benefit of the disclosure herein, that the particular arrangement of nodes in network 410—e.g., including the number of rows of the array configuration, the number of columns of the array configuration, the relative configuration of processors, switches and/or routers with respect to each other, etc.—is merely illustrative and not limiting on some embodiments. For example, in various embodiments, a topology of network 410 is adapted from any of various suitable ring, star, or mesh fabric (or other) multi-core network architectures, which are not limiting on some embodiments, and which are not detailed herein to avoid obscuring certain features of various embodiments. It is further to be appreciated that the particular number, arrangement and/or types of PHYs coupled to network 410 is also merely illustrative, and not limiting on some embodiments.

Figure 5A:
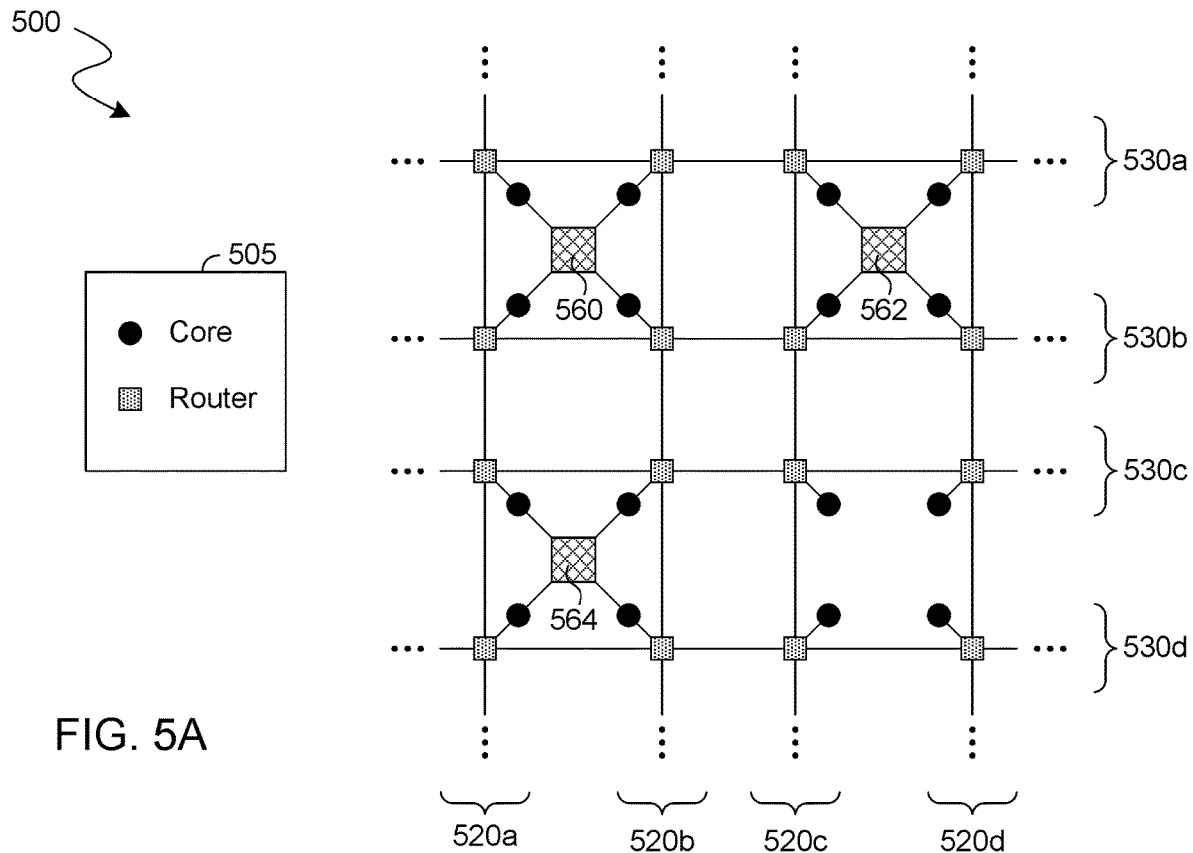
FIG. 5A illustrates a layout diagram showing elements of an integrated circuit chip which is configured to access a memory chiplet according to an embodiment.

FIG. 5A shows features of an IC chip 500 to access memory resources of a chiplet according to another embodiment. IC chip 500 is one example of an embodiment wherein a host chip includes a network or nodes including multiple cores, wherein IO circuitry of the host chip is variously disposed at different locations in the network to accommodate communications each between a respective core and a respective memory resource of one or more chiplets. In various embodiments, IC chip 500 includes features of host chip 112 or circuit resources 305—e.g., where IC chip 500 is to be coupled to operate with a memory of a chiplet according to method 200.

As shown in FIG. 5A, IC chip 500 comprises a network of nodes including routers and processor cores (see legend 505). Various ones of the nodes are coupled to one another in an array configuration comprising rows and columns. By way of illustration and not limitation, IC chip 500 includes features of IC chip 400—e.g., wherein rows 530a-530d of IC chip 500 correspond functionally to rows 430a, 430b, . . . , 430m, and wherein columns 520a-520d of IC chip 500 correspond functionally to columns 420a, 420b, . . . , 420n. In one such embodiment, IC chip 500 further comprises IO circuitry 560 which is coupled to facilitate chiplet access by cores that (for example) are variously linked each to a respective router which is in one of rows 530a, 530b and also in one of columns 520a, 520b. Alternatively or in addition, IO circuitry 562 of IC chip 500 is coupled to facilitate chiplet access by cores that are variously linked each to a respective router which is in one of rows 530a, 530b and also in one of columns 520c, 520d. Alternatively or in addition, IO circuitry 564 of IC chip 500 is coupled to facilitate chiplet access by cores that are variously linked each to a respective router which is in one of rows 530c, 530d and also in one of columns 520a, 520b. In various embodiments, a given one of IO circuitry 560, 562, 564 further comprises cache controller circuitry which, for example, provides functionality of cache controller 164 or one of cache controllers 332. In other embodiments, such functionality of a cache controller is instead implemented on a chiplet that is to couple to IC chip 500 via the given one of IO circuitry 560, 562, 564.

Figure 5B:
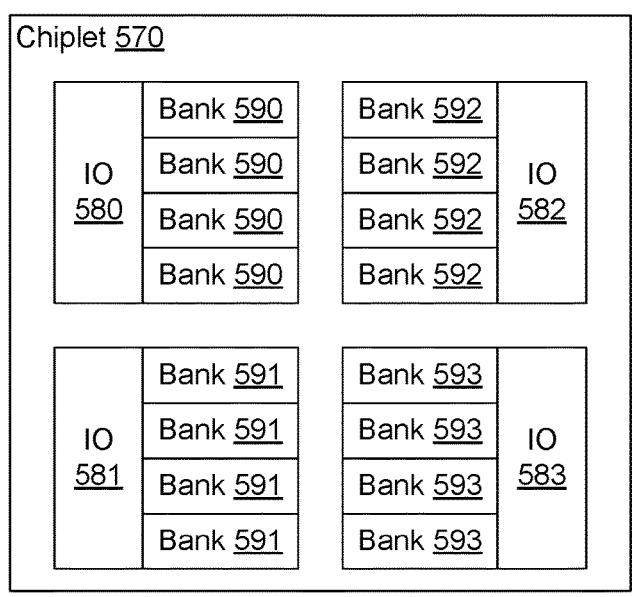
FIG. 5B illustrates a functional block diagram showing elements of a memory chiplet according to an embodiment.

FIG. 5B shows features of a chiplet 570 to be packaged with, and to provide memory resources for, a host chip according to an embodiment. Chiplet 570 is one example of an embodiment wherein multiple IO circuits are each operable to provide access a respective one or more memory banks—e.g., wherein the IO circuits are each to be coupled to a different respective network node of a host chip. In one such embodiment, chiplet 570 provides memory resource access to a host chip according to method 200—e.g., wherein chiplet 570 includes features of chiplet 124, for example.

As shown in FIG. 5B, chiplet 570 includes various IO circuits 580-583 which each provide respective functionality of IO circuitry 182, for example. IO circuits 580-583 are coupled each to provide access to a respective one or more memory banks of chiplet 570. In the example embodiment shown, banks 590 of chiplet 570 are accessible via IO circuit 580—e.g., wherein banks 591 are accessible via IO circuit 581, banks 592 are accessible via IO circuit 582, and/or banks 593 are accessible via IO circuit 583. In some embodiments, chiplet 570 includes $2^N$ IO circuits (where N is a positive integer) that, for example, are each to support communication with a different respective core of a host chip.

In an illustrative scenario according to one embodiment, chiplet 570 supports coupling to IC chip 500—e.g., wherein IO circuitry 560 (for example) includes IO circuits which are each configured to couple—via a hardware interface such as hardware interface 120—to a respective one of IO circuits 581-583. In another such embodiment, chiplet 570 supports coupling to IC chip 400—e.g., wherein cache controller circuitry 460, 462, 464 each includes an IO circuit to couple to different respective one of IO circuits 581-583.

In the example embodiment shown, IO circuits 580-583 are variously arranged around a periphery of a region which includes memory banks 590-593—e.g., wherein none of IO circuits 580-583 is between any two of memory banks 590-593. In other embodiments, memory banks 590-593 are variously arranged around a periphery of a region which includes IO circuits 580-583—e.g., wherein none of memory banks 590-593 is between any two of IO circuits 580-583. In various embodiments, conductive contacts which couple a given one of IO circuits 580-583 to a corresponding IO circuit of a host chip (e.g., to an IO circuit of IO circuitry 560) are disposed over a corresponding one or more memory banks. In one such embodiment, said conductive contacts—e.g., comprising microbumps, or hybrid bonding pads—accommodate a required number of electrical connections and/or a required physical pitch to access said one or more memory banks.

Figure 6A:
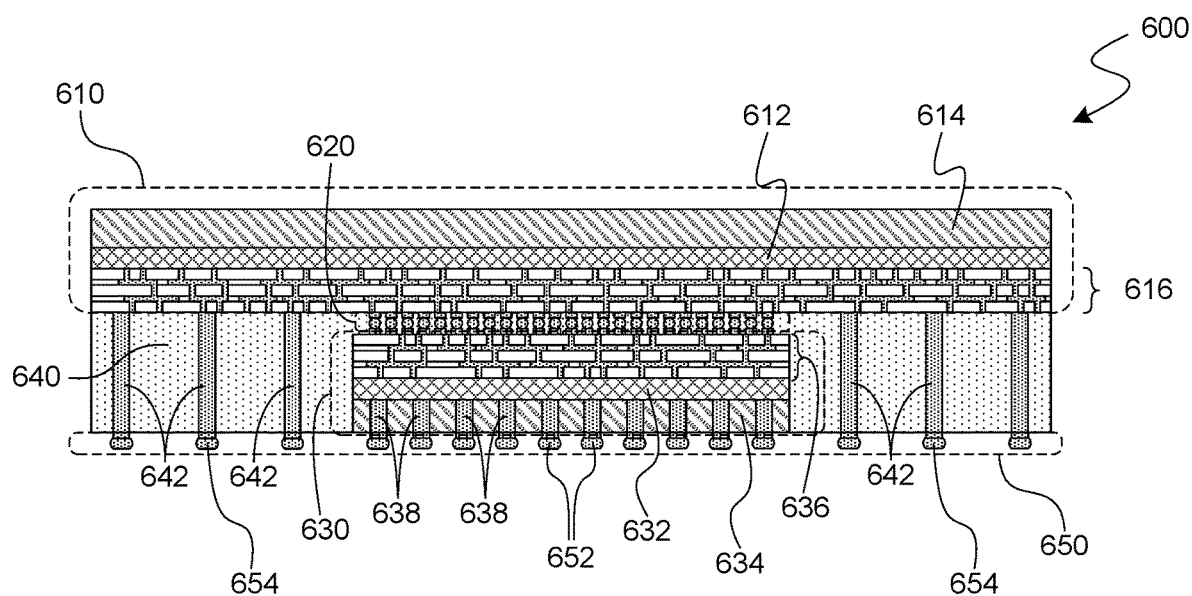
FIGS. 6A, 6B illustrate cross-sectional side views each of a respective packaged device according to a corresponding embodiment.

FIG. 6A shows features of a packaged device 600 to provide memory access with a host chip and a chiplet according to an embodiment. Packaged device 600 is one example of an embodiment wherein a chiplet, disposed between a host chip and hardware interface, includes memory resources which are accessible to one or more processor cores of the host chip. Functionality of packaged device 600 is provided according to method 200, for example.

As shown in FIG. 6A, packaged device 600 includes a host chip 610 and a chiplet 630 which is coupled thereto via a hardware interface 620. Host chip 610 includes one or more processor cores, and memory resources of chiplet 630 are coupled to be variously accessible by some or all such one or more processor cores. In one such embodiment, host chip 610 provides functionality of one of chips 112, 400, 500—e.g., wherein chiplet 630 provides functionality of one of chiplets 124, 570, and wherein hardware interface 620 corresponds functionally to hardware interface 120.

In the example embodiment shown, host chip 610 comprises a semiconductor substrate 614 and a device layer 612 including transistors and/or other circuit elements which are variously fabricated on substrate 614. Device layer 612 includes one or more processor cores which, for example, include cores 310, cores of network 410, or any of various other suitable arrangements of cores. Host chip 610 further comprises one or more metallization layers (e.g., including the illustrative metallization layers 616 shown) which variously interconnect circuit structures of device layer 612 with each other, with hardware interface 620 and/or with a hardware interface 650 of packaged device 600. Hardware interface 650 corresponds functionally to hardware interface 132, for example.

Chiplet 630 similarly comprises a semiconductor substrate 634 and a device layer 632 including transistors and/or other circuit elements which are variously fabricated on substrate 634. However, device layer 632 includes transistors and/or other circuit elements of one or more memory arrays which, for example, include banks 187, banks 590-593, or any of various other suitable arrangements of one or more memory resources. Chiplet 630 further comprises one or more metallization layers (e.g., including the illustrative metallization layers 636 shown) which variously interconnect circuit structures of device layer 632 with each other, with hardware interface 620 and/or with hardware interface 650. In various embodiments, hardware interface 650 includes one or more first conductive contacts—e.g., including the illustrative contacts 652 shown—which are at a side of chiplet 630 (other than the side of chiplet 630 where hardware interface 620 is disposed). In one such embodiment, hardware interface 650 further comprises one or more second conductive contacts (e.g., including the illustrative contacts 654 shown) which are offset from chiplet 630.

In one such embodiment, some or all of the one or more first contacts are variously coupled (or otherwise accommodate coupling) each to facilitate a respective signal communication and/or voltage communication between hardware interface 650 and metallization layers 636—e.g., wherein such communication is through device layer 632 and substrate 634. By way of illustration and not limitation, chiplet 630 further comprises at least some interconnect structures (such as the illustrative interconnects 638 shown) which variously extend each to a respective one of the one or more first contacts of hardware interface 650, through substrate 634, and to—and in some embodiments, through—device layer 632. In one such embodiment, some or all of interconnects 638 are variously coupled, each to respective patterned conductor of metallization layers 636, to facilitate signal communication or power delivery with host chip 610 (via hardware interface 620) and/or with circuitry of device layer 632.

Additionally or alternatively, some or all of the one or more second contacts are variously coupled (or otherwise accommodate coupling) each to facilitate a respective signal communication and/or voltage communication between hardware interface 650 and host chip 610, where such communication is independent of chiplet 630. By way of illustration and not limitation, packaged device 600 further comprises insulation 640—e.g., including a mold compound or an interlayer dielectric (ILD) material—which has formed therein at least some interconnect structures (such as the illustrative interconnects 642 shown) which variously extend each to a respective one of the one or more second contacts of hardware interface 650, and also to a respective conductive contact at a side of metallization layers 616. For example, interconnects 642 comprise copper pillars and/or any of various other conductors which are suitable to communicate signal and/or voltages through insulation 640. In some embodiments, a mold compound, ILD and/or any other such material of insulation 640 is to be distinguished, for example, from an underfill (if any) which is to be deposited under and/or around hardware interface 650.

Figure 6B:
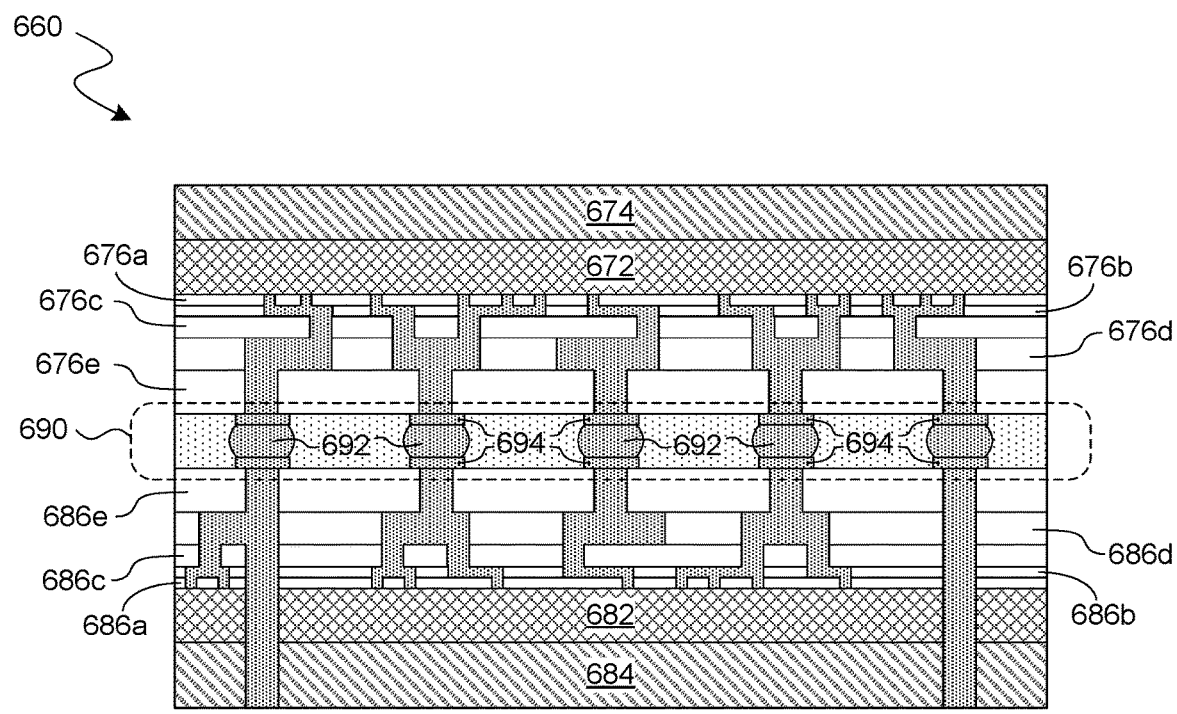

In the example embodiment shown, hardware interface 620 comprises solder interconnects which variously couple respective contacts of host chip 610 and chiplet 630 to each other. For example, FIG. 6B shows a detailed view of a packaged device 660, according to an embodiment, such as packaged device 600. A host chip of packaged device 660 comprises a device layer 672 and a substrate 674 (e.g., device layer 612 and substrate 614, respectively). Said host chip is coupled via a hardware interface 690 to a chiplet of packaged device 660 which comprises a device layer 682 and a substrate 684 (e.g., device layer 632 and substrate 634, respectively).

For example, metallization layers 676a-676e of the host chip (e.g., metallization layers 616) have formed therein interconnect structures which variously couple device layer 672 electrically to hardware interface 690. In such an embodiment, metallization layers 686a-686e of the chiplet (e.g., metallization layers 636) have formed therein interconnect structures which variously couple device layer 682 electrically to hardware interface 690. Hardware interface 690 comprises conductive pads (e.g., including the illustrative pads 694 shown) which are variously disposed each at a respective side of one of the host chip or the chiplet. Solder interconnects (e.g., including the illustrative microbumps 692 shown) variously provide coupling, via pads 694, between the host chip and the chiplet By way of illustration and not limitation, one or more interconnects of the chiplet variously extend each from another hardware interface (not shown) of packaged device 660—e.g., from hardware interface 132—through substrate 684 and device layer 682, and back to circuit elements of device layer 682 via interconnect structures of metallization layers 686a-686e. Additionally or alternatively, one or more interconnects of the chiplet variously extend each from said other hardware interface, through substrate 684, device layer 682, and metallization layers 686a-686e to hardware interface 690—e.g., to deliver power to device layer 672 via metallization layers 676a-676e.

In various embodiments, packaged device 600 comprises multiple device layers which are each of a respective chiplet that is coupled to host chip 610—e.g., wherein chiplet 630 further comprises one or more other device layers (not shown) which are vertically offset from one another and interconnect by including, for example, through-hole vias, monolithic interlayer vias, or the like. In another such embodiment, chiplet 630 is one of a stack of chiplets which are coupled to host chip 610—e.g., wherein chiplets of the stack are variously coupled to one another by solder bumps or hybrid bonding pads, and where hardware interface 650 includes contacts at one such chiplet of the stack.

Figure 7A:
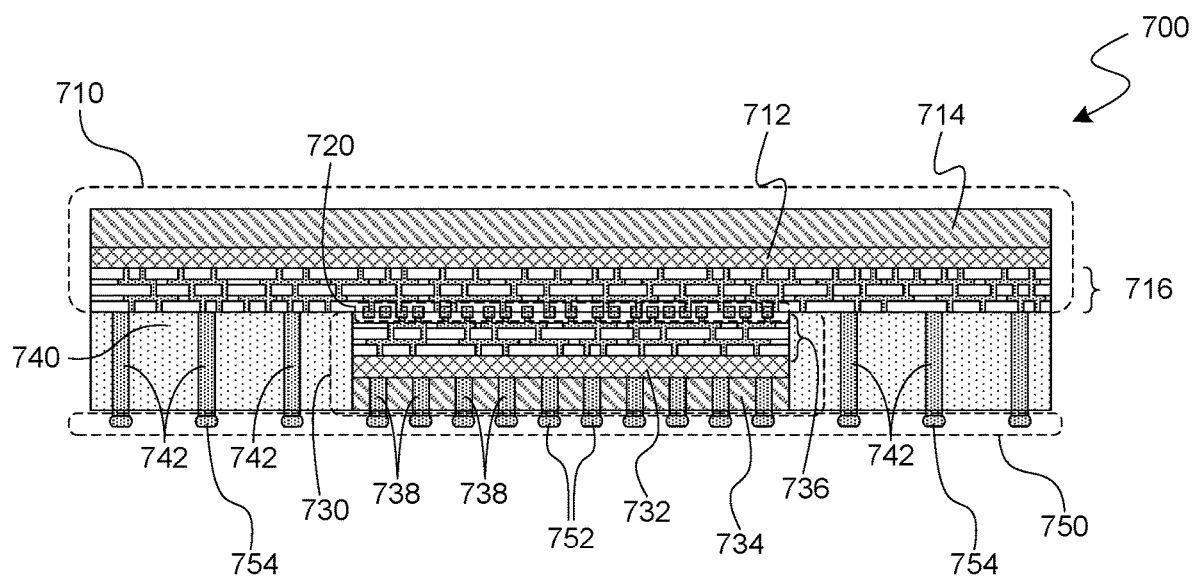
FIGS. 7A, 7B illustrate cross-sectional side views each of a respective packaged device according to a corresponding embodiment.

FIG. 7A shows features of a packaged device 700 to access memory resources of a chiplet according to another embodiment. Packaged device 700 is one example of an embodiment wherein a chiplet is coupled to make memory resources available to a host chip, wherein the chiplet and host chip are coupled to one another via any of various wafer level (or alternatively, chip level) direct bonding techniques including, for example, thermocompression bonding, hybrid bonding or the like. Functionality of packaged device 700 is provided according to method 200, for example.

As shown in FIG. 7A, packaged device 700 comprises a host chip 710 and a chiplet 730 which, for example, correspond functionally to host chip 610 and chiplet 630 (respectively). Host chip 710 and chiplet 730 are coupled to one another via a hardware interface 720, wherein another hardware interface 750 facilitates coupling of packaged device 700 to an interposer, a packaged substrate, a circuit board, or the like. Hardware interfaces 720, 750 are at opposite respective sides of chiplet 730—e.g., wherein hardware interfaces 720, 750 correspond functionally to hardware interfaces 620, 650 (respectively). In one such embodiment, hardware interface 750 comprises first conductive contacts (e.g., including contacts 752) at a bottom side of chiplet 730. By contrast, second conductive contacts of hardware interface 750 (e.g., including contacts 754) are offset from chiplet 730.

In the example embodiment shown, host chip 710 comprises a device layer 712, a semiconductor substrate 714, and metallization layers 716 which, for example, correspond functionally to device layer 612, substrate 614, metallization layers 616 (respectively). Chiplet 730 comprises a device layer 732, a semiconductor substrate 734, and metallization layers 736 which, for example, correspond functionally to device layer 632, substrate 634, metallization layers 636 (respectively). The first conductive contacts (e.g., contacts 752) of hardware interface 750 variously facilitate communication of one or more signals and/or one or more voltages each with a respective one of device layer 732 or device layer 712. For example, interconnects 738 (providing functionality of interconnects 638, for example) variously extend from the first contacts, through substrate 734, and at least to (and in some embodiments, through) device layer 732. In one such embodiment, the second conductive contacts (e.g., contacts 754) variously facilitate communication of one or more signals and/or one or more voltages via interconnects 742 which extend through an insulation 740—e.g., where such communication is independent of chiplet 730.

Figure 7B:
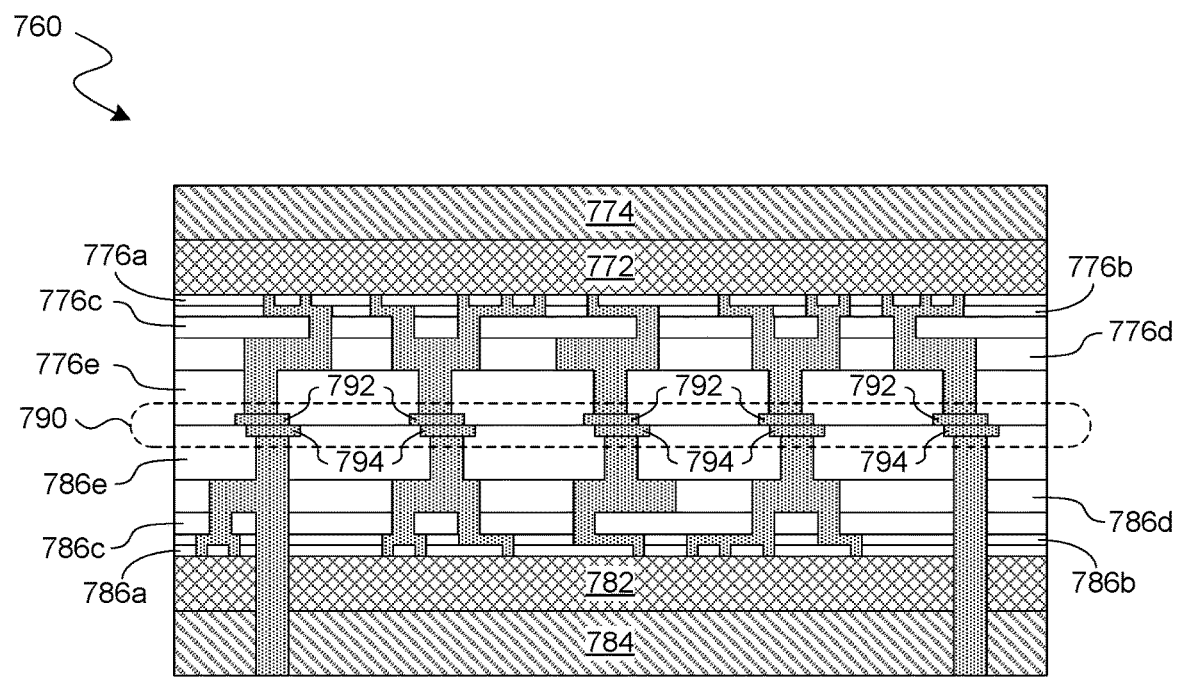

In the example embodiment shown, hardware interface 720 comprises directly bonded interconnect structures which couple host chip 710 and chiplet 730 to each other. For example, FIG. 7B shows a detailed view of a packaged device 760 which, according to an embodiment, includes one or more interface structures such as those of packaged device 700. As shown in FIG. 7B, a host chip of packaged device 760 comprises a device layer 772 and a substrate 774 (e.g., device layer 712 and substrate 714, respectively). Said host chip is coupled via a hardware interface 790 to a chiplet of packaged device 760 which comprises a device layer 782 and a substrate 784 (e.g., device layer 732 and substrate 734, respectively).

Metallization layers 776a-776e of the host chip have formed therein interconnect structures which variously couple device layer 772 electrically to hardware interface 790. In such an embodiment, metallization layers 786a-786e of the chiplet have formed therein interconnect structures which variously couple device layer 782 electrically to hardware interface 790. At hardware interface 790, conductive pads 792 of the host die are each bonded to a respective one of conductive pads 794 of the chiplet. In one such embodiment, one or more interconnects of the chiplet variously extend each from another hardware interface (not shown) of packaged device 760, through substrate 784 and device layer 782, and back to circuit elements of device layer 782 via interconnect structures of metallization layers 786a-786e. Additionally or alternatively, one or more interconnects of the chiplet variously extend each from said other hardware interface, through substrate 784, device layer 782, and metallization layers 786a-786e to hardware interface 790—e.g., to deliver power to device layer 772 via metallization layers 776a-776e.

In various embodiments, packaged device 700 comprises multiple device layers which are each of a respective chiplet that is coupled to host chip 710—e.g., wherein chiplet 730 further comprises one or more other device layers (not shown) which are vertically offset from one another and interconnect by including, for example, through-hole vias, monolithic interlayer vias, or the like. In another such embodiment, chiplet 730 is one of a stack of chiplets which are coupled to host chip 710—e.g., wherein chiplets of the stack are variously coupled to one another by solder bumps or hybrid bonding pads, and where hardware interface 750 includes contacts at one such chiplet of the stack.

Figure 8:
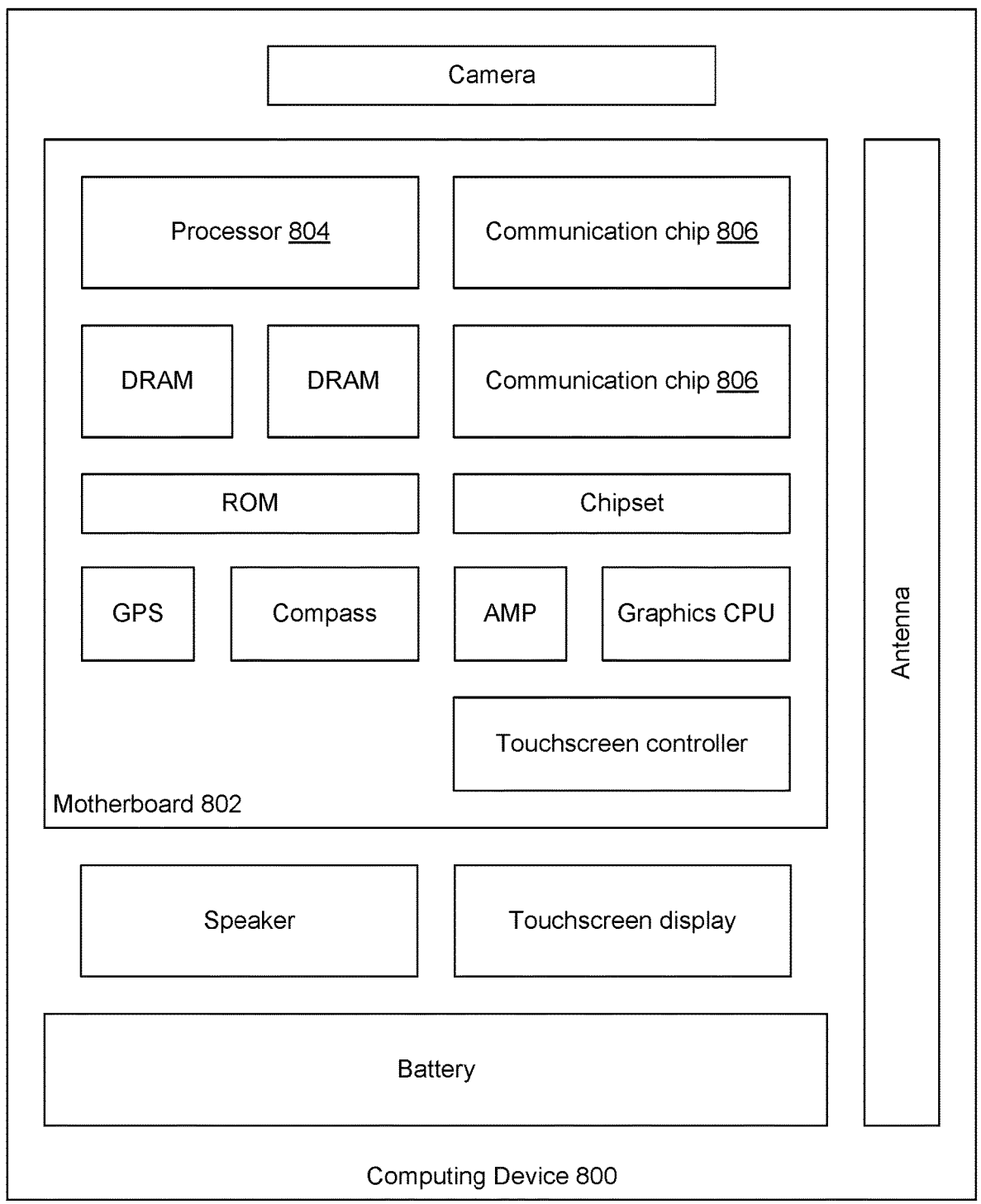
FIG. 8 illustrates a functional block diagram showing a computing device in accordance with one embodiment.

FIG. 8 illustrates a computing device 800 in accordance with one embodiment. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. The term "processor" may refer to any device or portion of a device that processes electronic data from registers and/or memory to transform that electronic data into other electronic data that may be stored in registers and/or memory. The communication chip 806 also includes an integrated circuit die packaged within the communication chip 806.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 9:
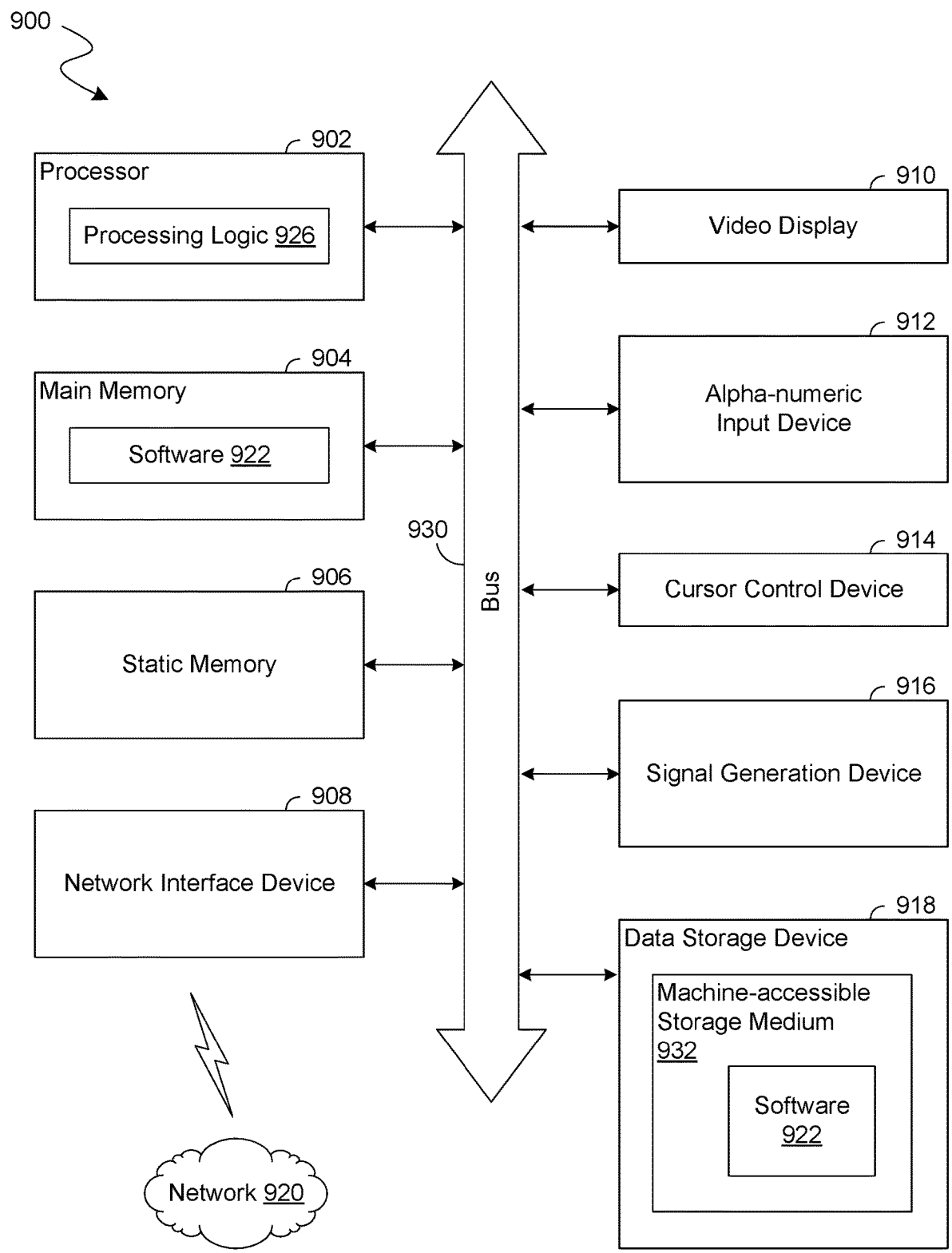
FIG. 9 illustrates a functional block diagram showing an exemplary computer system, in accordance with one embodiment.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 932 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Figure 10:
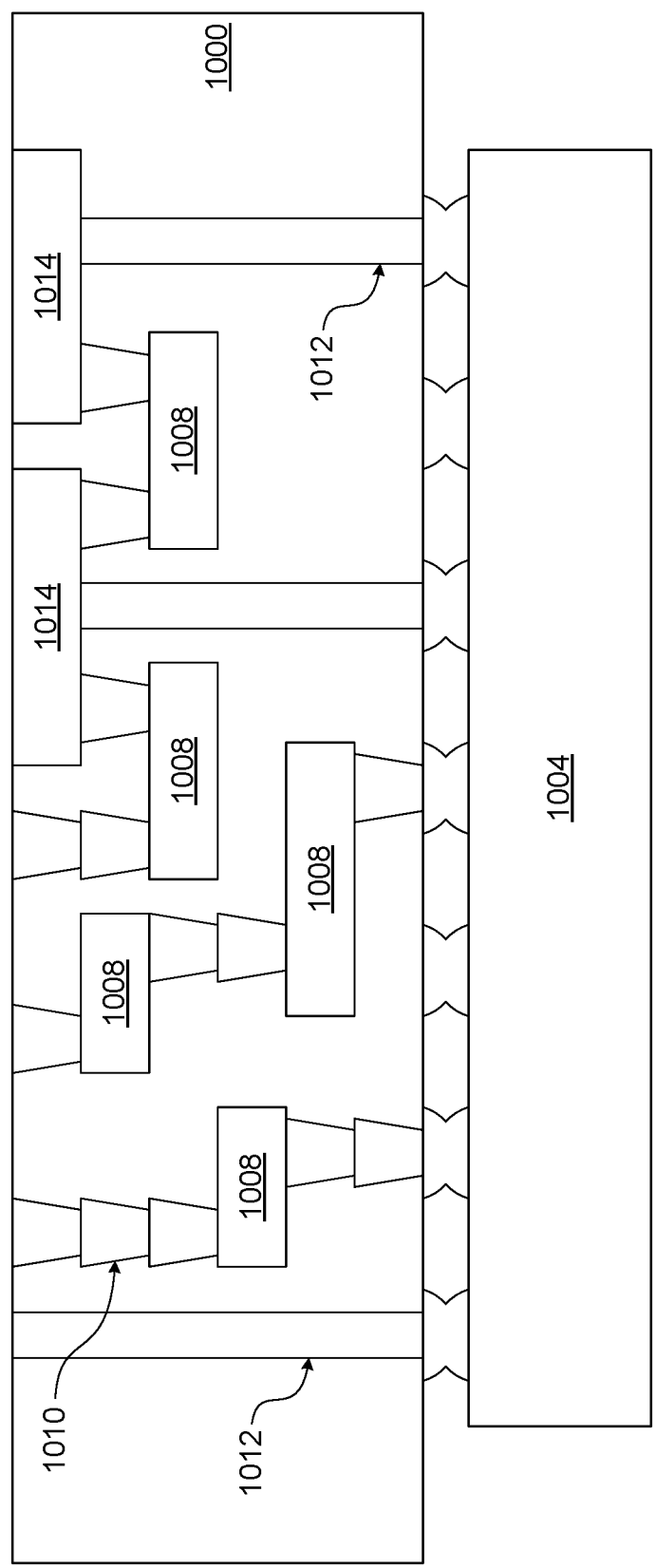
FIG. 10 illustrates a cross-sectional view of an interposer implementing one or more embodiments.

FIG. 10 illustrates an interposer 1000 that includes one or more embodiments. The interposer 1000 is an intervening substrate used to bridge a first substrate to a second substrate 1004. The first substrate may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first substrate and the second substrate 1004 are attached to opposing sides of the interposer 1000. In other embodiments, the first substrate and the second substrate 1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with some embodiments, apparatuses or processes disclosed herein may be used in the fabrication of interposer 1000.

Techniques and architectures for providing improved data locality in a packaged device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A packaged device comprising:
   a host chip comprising a processor core;
   a chiplet comprising a memory coupled to communicate with the processor core via a first hardware interface at a first side of the chiplet; and
   a second hardware interface comprising conductive contacts at a second side of the chiplet, wherein the second side is opposite the first side, wherein a first minimum metallization feature pitch of the first hardware interface is smaller than a second minimum metallization feature pitch of the second hardware interface, wherein the chiplet overlaps a first surface region of the host chip, and wherein, of the chiplet and the second hardware interface, a second surface region of the host chip is overlapped by only the second hardware interface.

2. The packaged device of claim 1, wherein a first device layer of the host chip comprises the processor core, and wherein a second device layer of the chiplet comprises the memory, wherein one of the first device layer or the second device layer is coupled to receive power via an interconnect which extends to the second hardware interface and at least partially through the chiplet.

3. The packaged device of claim 2, wherein the interconnect extends to the first hardware interface.

4. The packaged device of claim 1, wherein a first device layer of the host chip comprises:
   a switched network comprising the processor core, wherein nodes of the switched network are coupled to one another in an array configuration comprising rows and columns, wherein the memory is coupled to communicate with the processor core independent of any PHY circuit of the device layer which is coupled to the network via a respective end of one of the rows or one of the columns.

5. The packaged device of claim 1, wherein a first device layer of the host chip comprises the processor core and memory controller circuitry coupled between the processor core and the memory, the memory controller circuitry to provide the processor core with access to the memory.

6. The packaged device of claim 1, wherein the memory comprises one of a static random access memory or a dynamic random access memory.

7. The packaged device of claim 1, wherein the memory comprises a non-volatile memory.

8. The packaged device of claim 1, wherein the processor core is coupled to cache data to the memory.

9. The packaged device of claim 8, wherein the processor core is coupled to access a last level cache of the memory.

10. The packaged device of claim 1, wherein the processor core is a first processor core, wherein the host chip further comprises a second processor core, wherein the memory comprises a first memory bank and a second memory bank, and wherein the chiplet further comprises:
    a first input/output (IO) circuit coupled between the first processor core and the first memory bank; and
    a second IO circuit coupled between the second processor core and the second memory bank;
    wherein a first cache controller is coupled between the first memory bank and the first processor core, and wherein a second cache controller is coupled between the second memory bank and the second processor core.

11. The packaged device of claim 10, wherein the chiplet includes the first cache controller and the second cache controller.

12. A method comprising:
    forming a host chip comprising a processor core;
    forming a chiplet comprising a memory array;
    coupling the host chip to the chiplet, including coupling the memory array to the processor core via a first hardware interface at a first side of the chiplet;
    forming a second hardware interface comprising conductive contacts at a second side of the chiplet, wherein the second side is opposite the first side, wherein a first minimum metallization feature pitch of the first hardware interface is smaller than a second minimum metallization feature pitch of the second hardware interface, wherein the chiplet overlaps a first surface region of the host chip, and wherein, of the chiplet and the second hardware interface, a second surface region of the host chip is overlapped by only the second hardware interface.

13. The method of claim 12, wherein a first device layer of the host chip comprises the processor core, and wherein a second device layer of the chiplet comprises the memory, wherein one of the first device layer or the second device layer is coupled to receive power via an interconnect which extends to the second hardware interface and at least partially through the chiplet.

14. The method of claim 12, wherein a first device layer of the host chip comprises:
    a switched network comprising the processor core, wherein nodes of the switched network are coupled to one another in an array configuration comprising rows and columns, wherein the memory is coupled to communicate with the processor core independent of any PHY circuit of the device layer which is coupled to the network via a respective end of one of the rows or one of the columns.

15. The method of claim 12, wherein a first device layer of the host chip comprises the processor core and memory controller circuitry coupled between the processor core and the memory, the memory controller circuitry to provide the processor core with access to the memory.

16. The method of claim 12, wherein the memory comprises one of a static random access memory or a dynamic random access memory.

17. A system comprising
    a packaged device comprising:
    a host chip comprising a processor core;
    a chiplet comprising a memory coupled to communicate with the processor core via a first hardware interface at a first side of the chiplet; and
    a second hardware interface comprising conductive contacts at a second side of the chiplet, wherein the second side is opposite the first side, wherein a first minimum metallization feature pitch of the first hardware interface is smaller than a second minimum metallization feature pitch of the second hardware interface, wherein the chiplet overlaps a first surface region of the host chip, and wherein, of the chiplet and the second hardware interface, a second surface region of the host chip is overlapped by only the second hardware interface; and a display device coupled to the packaged device, the display device to display an image based on a signal communicated between the processor and the memory.

18. The system of claim 17, wherein a first device layer of the host chip comprises the processor core, and wherein a second device layer of the chiplet comprises the memory, wherein one of the first device layer or the second device layer is coupled to receive power via an interconnect which extends to the second hardware interface and at least partially through the chiplet.

19. The system of claim 17, wherein a first device layer of the host chip comprises:

a switched network comprising the processor core, wherein nodes of the switched network are coupled to one another in an array configuration comprising rows and columns, wherein the memory is coupled to communicate with the processor core independent of any PHY circuit of the device layer which is coupled to the network via a respective end of one of the rows or one of the columns.

20. The system of claim 17, wherein a first device layer of the host chip comprises the processor core and memory controller circuitry coupled between the processor core and the memory, the memory controller circuitry to provide the processor core with access to the memory.

* * * * *